(12) United States Patent
Kim

(10) Patent No.: US 7,790,349 B2
(45) Date of Patent: Sep. 7, 2010

(54) BLANKET FOR A PRINTING ROLL, METHOD OF MANUFACTURING THE SAME, PATTERNING METHOD USING THE SAME, AND METHOD OF MANUFACTURING LIQUID CRYSTAL DISPLAY DEVICE

(75) Inventor: Jin Wuk Kim, Gyeonggi-do (KR)

(73) Assignee: LG. Display Co., Ltd., Seoul (KR)

( * ) Notice: Subject to any disclaimer, the term of this patent is extended or adjusted under 35 U.S.C. 154(b) by 648 days.

(21) Appl. No.: 11/784,948

(22) Filed: Apr. 10, 2007

(65) Prior Publication Data

US 2007/0238051 A1   Oct. 11, 2007

(30) Foreign Application Priority Data

Apr. 10, 2006   (KR) .................. 10-2006-032446

(51) Int. Cl.
G03F 7/00   (2006.01)
G03F 7/004   (2006.01)
G03F 7/11   (2006.01)

(52) U.S. Cl. .................. 430/270.1; 430/330; 430/7; 430/311; 430/302; 428/690

(58) Field of Classification Search .............. 430/270.1, 430/330, 7, 311; 428/690
See application file for complete search history.

(56) References Cited

U.S. PATENT DOCUMENTS

| | | | | |
|---|---|---|---|---|
| 4,639,379 A | * | 1/1987 | Asai et al. .................. 427/489 |
| 5,264,284 A | * | 11/1993 | Miyata ........................ 428/364 |
| 5,352,507 A | * | 10/1994 | Bresson et al. ............. 428/35.9 |
| 5,754,931 A | * | 5/1998 | Castelli et al. .............. 399/297 |
| 5,934,192 A | * | 8/1999 | Ogita et al. .................. 101/217 |
| 5,974,974 A | * | 11/1999 | Agnew et al. ............ 101/401.1 |
| 6,054,251 A | * | 4/2000 | Imai et al. ................. 430/285.1 |
| 6,057,414 A | * | 5/2000 | Razavi ....................... 427/491 |
| 6,069,187 A | * | 5/2000 | Kusumoto et al. .......... 522/108 |
| 6,287,638 B1 | * | 9/2001 | Castelli et al. .............. 427/381 |
| 6,723,491 B2 | * | 4/2004 | Hannoch ................. 430/272.1 |
| 7,455,940 B2 | * | 11/2008 | Eun et al. ...................... 430/7 |
| 2004/0031407 A1 | * | 2/2004 | Invernizzi ................... 101/376 |
| 2004/0120739 A1 | * | 6/2004 | Chen et al. ................. 399/329 |
| 2005/0039619 A1 | * | 2/2005 | Invernizzi et al. ........... 101/376 |
| 2005/0136342 A1 | * | 6/2005 | Eun et al. ....................... 430/7 |
| 2006/0090660 A1 | * | 5/2006 | Oh ............................... 101/375 |

FOREIGN PATENT DOCUMENTS

CN   1470925 A   1/2004
EP   0942833 B1   7/1996

OTHER PUBLICATIONS

Office Action dated Mar. 6, 2009 for Chinese Patent Application No. 200710096346.6.

* cited by examiner

*Primary Examiner*—Amanda C. Walke
(74) *Attorney, Agent, or Firm*—Brinks Hofer Gilson & Lione

(57) ABSTRACT

A blanket for a printing roll is disclosed that includes an Si-based resin layer and an acrylate film formed on one surface of the Si-based resin layer, wherein the acrylate film prevents a volatile solvent from permeating into the blanket, to thereby prevent the blanket from being deformed.

18 Claims, 5 Drawing Sheets

BLANKET FOR A PRINTING ROLL, METHOD OF MANUFACTURING THE SAME, PATTERNING METHOD USING THE SAME, AND METHOD OF MANUFACTURING LIQUID CRYSTAL DISPLAY DEVICE

This application claims the benefit of Korean Patent Application No. 2006-32446 filed on Apr. 10, 2006, which is hereby incorporated by reference as if fully set forth herein.

BACKGROUND

1. Technical Field

The present invention relates to a printing roll to form minute patterns in liquid crystal display (LCD) devices and semiconductor devices, and more particularly, to a blanket being adhered to the printing roll.

2. Discussion of the Related Art

Generally, LCD devices and semiconductor devices are provided with a plurality of layers patterned on a substrate. Accordingly, various processes are performed to pattern the plurality of layers. In order to pattern the plurality of layers in various shapes, it is necessary to perform photolithography.

The photolithography necessarily uses a mask having a predetermined pattern and a light-irradiation apparatus, so that the manufacturing cost increases. In addition, since the photolithography requires exposure and development, it complicates the patterning process and increases manufacturing time.

To overcome these problems of photolithography, a new patterning method has been developed, for example, a printing method using a printing roll.

FIGS. 1A to 1C are views illustrating a patterning method using a related art printing roll.

First, as shown in FIG. 1A, a pattern material 20 is applied to a printing roll 30 on which a blanket 35 is adhered through a printing nozzle 10. Thus, the surface of printing roll 30 is coated with the pattern material 20. In this case, the pattern material 20 is mixed with a volatile solvent. The volatile solvent makes smooth the application of the pattern material 20 coated on the printing roll 30. Just after coating the printing roll 30 with the pattern material 20, the volatile solvent is vaporized.

After that, as shown in FIG. 1B, the printing roll 30 is rotated on a printing plate 40 provided with a plurality of protrusions 20b. As a result, some of the pattern material is transferred to the protrusions of the printing plate 40, and the remaining pattern material 20a forms a predetermined pattern on the printing roll 30.

Referring to FIG. 1C, the printing roll 30 is rotated on a substrate 50, whereby the remaining pattern material 20a of the printing roll 30 is transferred to the substrate 50, thereby forming the desired pattern on the substrate 50.

The blanket 35 requires good adherence to the printing roll 30, and also requires anti-deformation properties to resist deformation during the printing process. In this respect, the blanket 35 is generally formed of an Si-based resin. However, the Si-based resin is weakened by permeation of the volatile solvent which melts the pattern material 20. Thus, the blanket 35 of Si-based resin may be deformed due to permeation of the volatile solvent. If the blanket 35 is deformed, it is difficult to smoothly perform the coating and printing process, so that the formed pattern is not precise.

SUMMARY

Accordingly, the present disclosure is directed to a blanket for printing roll, a method of manufacturing the blanket, a patterning method using the blanket, and a method of manufacturing an LCD device using a patterning method that substantially obviates one or more problems due to limitations and disadvantages of the related art.

According to one aspect, a blanket for a printing roll includes an Si-based resin layer, and an acrylate film formed on one surface of the Si-based resin layer.

In another aspect, a method of manufacturing a blanket for a printing roll includes preparing an Si-based resin layer and forming an acrylate film in one surface of the Si-based resin layer. The process of forming the acrylate film further includes coating one surface of the Si-based resin layer with a material to form the acrylate film and applying ultraviolet rays to the Si-based resin layer coated with the acrylate film.

In yet another aspect, a photolithography patterning method includes applying a pattern material to a printing roll to which a blanket is adhered, rotating the printing roll on a printing plate provided with a plurality of protrusions to transfer some of the pattern material to the protrusions of printing plate, and rotating the printing roll on a substrate to transfer the remaining pattern material of printing roll to the substrate. The blanket used may correspond to the above-described blanket for a printing roll.

In yet another aspect, a method of manufacturing an LCD device includes forming a light-shielding layer on a first substrate, forming a color filter layer on the first substrate that includes the light-shielding layer, preparing a second substrate, and forming a liquid crystal layer between the first and second substrates, wherein at least any one of forming the light-shielding layer on the first substrate and forming the color filter layer thereon is carried out by the above-mentioned patterning method.

It is to be understood that both the foregoing general description and the following detailed description of the present invention are exemplary and explanatory and are intended to provide further explanation of the invention as claimed.

BRIEF DESCRIPTION OF THE DRAWINGS

Non-limiting and non-exhaustive embodiments of the disclosure are described, including various embodiments of the disclosure with reference to the below Figures.

DETAILED DESCRIPTION

The embodiments of this disclosure will be best understood by reference to the drawings, wherein like parts are designated by like numerals throughout wherever possible. It will be readily understood that the components of the embodiments, as generally described and illustrated in the Figures herein, could be arranged and designed in a wide variety of different configurations. Thus, the following more detailed description of various embodiments, as represented in the Figures, is not intended to limit the scope of the invention, but is merely representative of various embodiments. While the various aspects of the embodiments are presented in drawings, the drawings are not necessarily drawn to scale unless specifically indicated. In addition, the steps of a method do not necessarily need to be executed in any specific order or even sequentially, unless otherwise specified or required for proper deployment of certain embodiments of a body harness apparatus.

Hereinafter, a blanket for a printing roll according to the present invention will be explained with reference to the accompanying drawings.

Figure 1A:
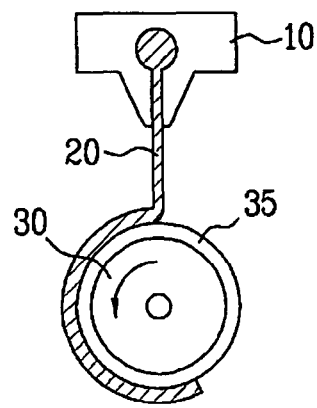
FIGS. 1A to 1C are views illustrating a patterning method using a printing roll according to the related art.
Figure 1B:
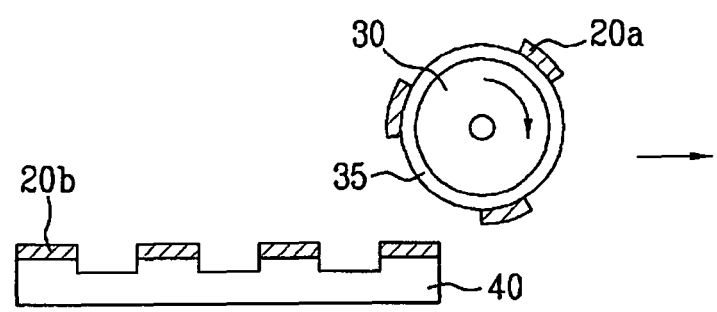
Figure 1C:
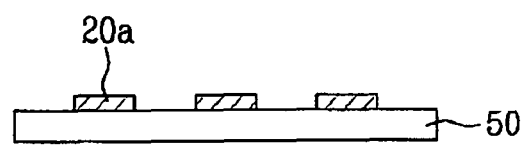
Figure 2:
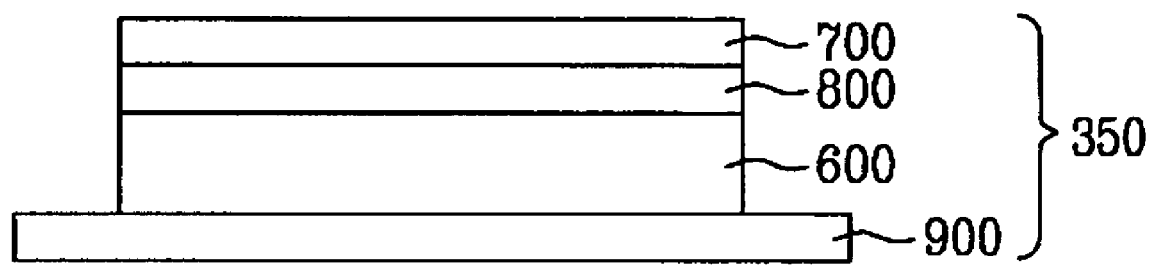
FIG. 2 is a cross-section view illustrating a blanket for printing roll according to an embodiment of the present disclosure.

FIG. 2 is a cross-section view illustrating a blanket 350 for a printing roll (300 in FIG. 3C) according to an embodiment of the present disclosure.

As shown in FIG. 2, a blanket 350 for the printing roll 300 includes an Si-based resin layer 600, an acrylate film 700, an oxide film 800, and a fixation film 900.

The Si-based resin layer 600 is formed of polydimethyl siloxane (PDMS) which is a type of Si-based elastic material. In this case, the PDMS may be easily deformed by a volatile solvent since PDMS is weakened by permeation of volatile solvents. In this respect, the acrylate film 700 is formed on the Si-based resin layer 600 of PDMS to prevent the Si-based resin layer 600 from being deformed.

Next, the oxide film 800 is formed between the Si-based resin layer 600 and the acrylate film 700 so as to improve the adhesive power therebetween. The oxide film 800 is formed because the PDMS of the Si-based resin layer 600 has a low surface energy. That is, the acrylate film 700 is not adhered to the Si-based resin layer 600 due to the low surface energy of the PDMS. In more detail, the surface energy corresponds to energy per each unit area required so as to obtain the interface between a solid or a liquid state and a gas state. For example, if a predetermined material has a low surface energy, the interface is easily formed between the predetermined material and the gas, so that another material does not adhere to the material. Also, the oxide film 800 may be formed by treating the surface of the PDMS of the Si-based resin layer 600 with oxygen plasma.

In order to improve the adhesive power between the Si-based resin layer 600 and the acrylate film 700, the acrylate film 700 is preferably formed of a material which is similar in solubility to the PDMS. If the Si-based resin layer 600 is similar in solubility to the acrylate film 700, they are easily mixed together because they recognize themselves as the same material. Accordingly, if the acrylate film 700 is formed of material having solubility similar to that of the PDMS, the acrylate film 700 is smoothly interdiffused to the Si-based resin layer 600, whereby the acrylate film 700 and the Si-based resin layer 600 are formed as one body.

Accordingly, it is possible to improve the adhesive power between the Si-based resin layer 600 and the acrylate film 700. Even though the Si-based resin layer 600 and the acrylate film 700 are formed as one body, the Si-based resin layer 600 is covered with the acrylate film 700. Thus, the acrylate film 700 protects the Si-based resin layer 600 from permeation of the solvent.

The solubility of the Si-based resin layer 600 is approximately 7.3 $[cal^{1/2}cm^{-3/2}]$. Thus, it is preferable to provide a material for acrylate film 700 having a solubility between about 6 $[cal^{1/2}cm^{-3/2}]$ and about 11 $[cal^{1/2}cm^{-3/2}]$. For example, the acrylate film 700 may be formed of glycidyl methacrylate (GMA), butyl methacrylate (BMA), glycidyl acrylate, or butyl acrylate.

The material for acrylate film 700 may contain a photoinitiator, preferably of an amount less than about 10% by weight. The photoinitiator optimizes the cross-linking of the acrylate film 700, and makes the acrylate film 700 protect the Si-based resin layer 600 from permeation by the solvent. The photoinitiator may be formed of {2-benzyl-2-dimethylamino-1-(4-morpholinophenyl)-butanone-1}.

The fixation film 900 supports the Si-based resin layer 600 so as to prevent the blanket 350 from being deformed when the blanket 350 is wound on the printing roll 300 or the printing process is performed. At this time, the fixation film 900 is formed on the rear surface of Si-based resin layer 600. Preferably, the fixation film 900 is formed of a flexible material so that the fixation film 900 is smoothly wound on the printing roll 300. For example, the fixation film 900 may be formed of polyethyl-eneterephthalate (PET), polymethylmethacrylate (PMMA), or polycarbonate (PC). In order to support the Si-based resin layer, the fixation film 900 is preferably formed at a thickness from approximately 10 μm to approximately 1 mm. The fixation film 900 has such a thickness as to allow itself to be smoothly wound on the printing roll 300 and to support the blanket 350.

Figure 3A:
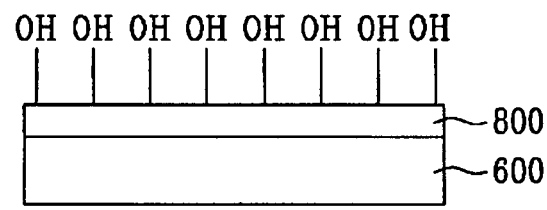
FIGS. 3A to 3C are views illustrating a method of manufacturing a blanket for a printing roll according to an embodiment of the present disclosure.
Figure 3B:
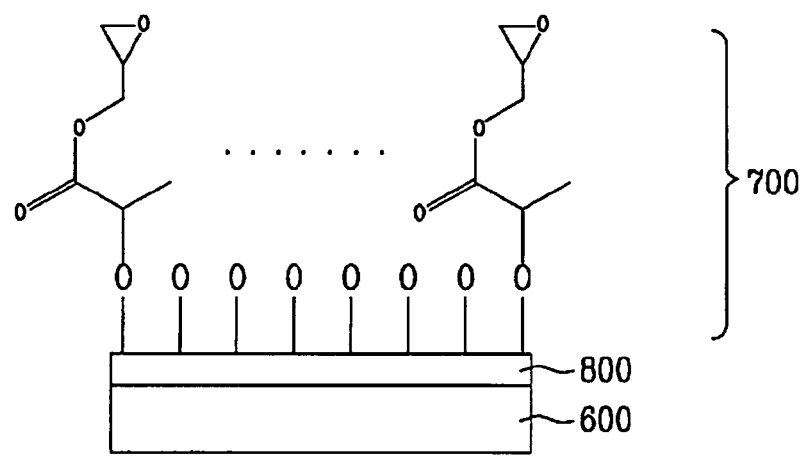
Figure 3C:
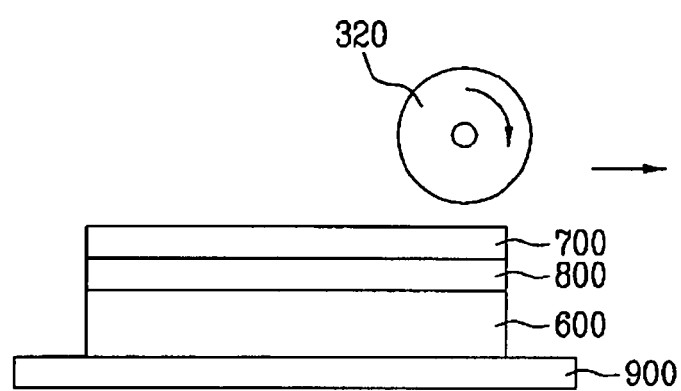

FIGS. 3A to 3C are views illustrating a method of manufacturing a blanket for a printing roll 300 according to an embodiment of the present disclosure.

To manufacture the blanket 350 for the printing roll 300 according to the preferred embodiment of the present invention, as shown in FIG. 3A, one surface of the PDMS of the Si-based resin layer 600 is treated with oxygen plasma, whereby the oxide film 800 is formed on one surface of PDMS. In this case, since hydroxyl radicals (—OH) are formed on the surface of oxide film 800, the PDMS is easily adhered to different kinds of material.

As shown in FIG. 3B, the acrylate film 700 is formed on the oxide film 800. The acrylate film 700 may be formed of glycidyl methacrylate (GMA). Here, glycidyl methacrylate (GMA) reacts on the hydroxyl radicals (—OH) of the oxide film 800, so that glycidyl methacrylate (GMA) is displaced in the hydrogen position of hydroxyl radicals, and is combined with the oxide film 800. In addition, the acrylate film 700 may be formed of butyl methacrylate (BMA), glycidyl acrylate, or butyl acrylate. At this time, glycidyl methacrylate (GMA), butyl methacrylate (BMA), glycidyl acrylate, and butyl acrylate are liquid pre-polymer type acrylates, which are smoothly interdiffused into the PDMS so that it is possible to form the acrylate film 700 in this type of interface with the PDMS.

The material for the acrylate film 700 may contain a photoinitiator of an amount less than about 10% by weight. After that, ultraviolet rays having wavelengths from about 300 [m] to about 450 [m] are applied to the acrylate film 700 to cure the acrylate film 700.

As shown in FIG. 3C, the fixation film 900 is adhered to the rear surface of Si-based resin layer 600 by a roller 320. The fixation film 900 supports the Si-based resin layer 600. Also, the fixation film 900 may be formed of polyethyleneterephthalate (PET), polymethylmethacrylate (PMMA), or polycarbonate (PC).

Figure 4A:
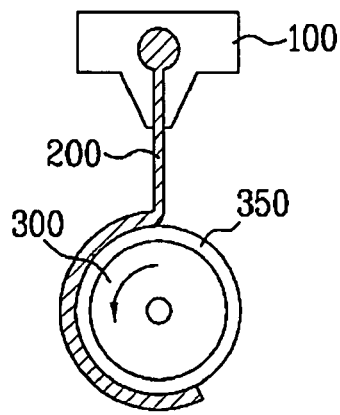
FIGS. 4A to 4C are views illustrating a patterning method according to an embodiment of the present disclosure.
Figure 4B:
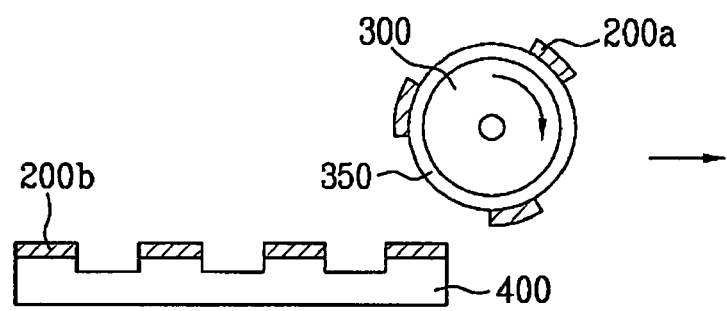
Figure 4C:
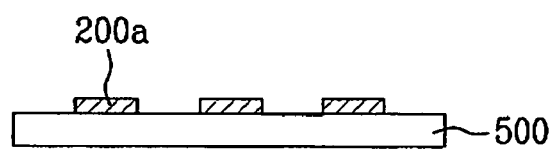

FIGS. 4A to 4C are views illustrating a patterning method according to an embodiment of the present disclosure.

First, as shown in FIG. 4A, a pattern material 200 is applied to a printing roll 300 on which a blanket 350 is adhered through a printing nozzle 10.

Then, as shown in FIG. 4B, the printing roll 300 is rotated on a printing plate 400 provided with a plurality of protrusions 200b. As a result, some of the pattern material is transferred to the protrusions 200b of the printing plate 400 and the remaining pattern material 200a forms a predetermined pattern on the printing roll 300.

As shown in FIG. 4C, as the printing roll 300 is rotated on a substrate 500, the remaining pattern material 200a is transferred to the substrate 500, whereby the desired pattern is formed on the substrate 500.

FIGS. 5A to 5D are views illustrating a method of manufacturing an LCD device according to an embodiment of the present disclosure.

Figure 5A:
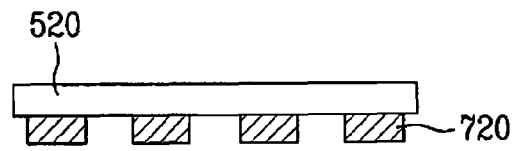
FIGS. 5A to 5D are views illustrating a method of manufacturing an LCD device according to an embodiment of the present disclosure.
Figure 5B:
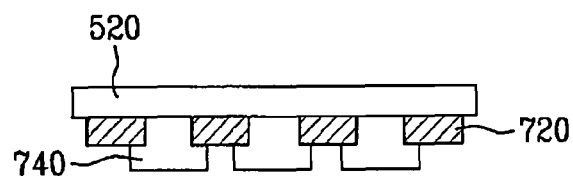

As shown in FIG. 5A, a light-shielding layer 720 is formed on a first substrate 520. Next, as shown in FIG. 5B, a color filter layer 740 is formed on the first substrate 520 that includes the light-shielding layer 720. At this time, at least one of the processes of forming the light-shielding layer 720 (FIG. 5A) and forming the color filter layer 740 (FIG. 5B) is carried out by the above-discussed patterning method.

Figure 5C:

As shown in FIG. 5C, a second substrate 550 is prepared. Although not shown, the second substrate 550 is formed by steps of forming gate and data lines crossing each other to define pixel regions, forming a thin film transistor at each crossing point of the gate and data lines, and forming a pixel electrode connected with the thin film transistor.

Figure 5D:
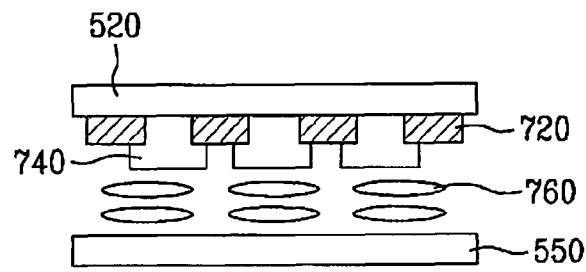

Then, a liquid crystal layer 760 is formed between the first and second substrates 520 and 550, as shown in FIG. 5D.

As mentioned above, the blanket 350 for a printing roll 300 according to the present disclosure and the method of manufacturing the same, the patterning method using the same, and the method of manufacturing the LCD device using the patterning method have at least the following advantages.

In the blanket 350 for the printing roll 300 according to the present disclosure, the acrylate film 700 formed on the Si-based resin layer 600 prevents the solvent from permeating into the blanket 350, so that it is possible to prevent the blanket 350 from being deformed. Also, the acrylate film 700 contains a photoinitiator that optimizes the cross-linking of acrylate film 700, and makes the acrylate film 700 protect the Si-based resin layer 600 from permeation by the solvent.

Furthermore, the oxide film 800 is formed between the Si-based resin layer 600 and the acrylate film 700, whereby the acrylate film is easily formed on the Si-based resin layer 600 having low surface energy. Also, the fixation film 900 is formed on the rear surface of Si-based resin layer 600 to prevent the blanket 350 from being deformed when the blanket 350 is wound on the printing roll 300 or the printing process is performed.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A blanket for a printing roll comprising:
   an Si-based resin layer;
   an acrylate film formed on one surface of the Si-based resin layer, wherein the acrylate film comes in contact with a pattern material including a solvent coated on the printing roll to protect the Si-based resin layer from permeation of the solvent; and
   an oxide film is formed between the Si-based resin layer and the acrylate film,
   wherein the acrylate film reacts on a hydroxyl radicals of the oxide film so that the acrylate film is displaced in a hydrogen position of the hydroxyl radicals, and is combined with the oxide film.

2. The blanket of claim 1, wherein the acrylate film has a solubility set between about 6 $cal^{1/2}cm^{-3/2}$ and about 11 $cal^{1/2}cm^{-3/2}$.

3. The blanket of claim 1, wherein the acrylate film comprises at least one of glycidyl methacrylate (GMA), butyl methacrylate (BMA), glycidyl acrylate, and butyl acrylate.

4. The blanket of claim 1, wherein the acrylate film comprises a photoinitiator.

5. The blanket of claim 4, wherein the photoinitiator is present in an amount from about 0 to about 10% by weight.

6. The blanket of claim 4, wherein the photoinitiator is formed from {2-benzyl-2-dimethylamino-1-(4-morpholinophenyl)-butanone-1}.

7. The blanket of claim 1, wherein the Si-based resin layer is formed from polydimethyl siloxane (PDMS).

8. The blanket of claim 1, wherein a fixation film is formed on the other surface of Si-based resin layer.

9. The blanket of claim 8, wherein the fixation film is comprises at least one of polyethyleneterephthalate (PET), polymethylmethacrylate (PMMA), and polycarbonate (PC).

10. The blanket of claim 8, wherein the fixation film has a thickness of from about 10 μm to about 1 mm.

11. A method of manufacturing a blanket for a printing roll comprising:
    preparing an Si-based resin layer;
    forming an oxide film on the Si-based resin layer by treating one surface of the Si-based resin layer with oxygen plasma; and
    forming an acrylate film in the one surface of the oxide film, wherein the acrylate film comes in contact with a pattern material including a solvent coated on the printing roll to protect the Si-based resin layer from permeation of the solvent; and
    wherein the acrylate film reacts on a hydroxyl radicals of the oxide film so that the acrylate film is displaced in a hydrogen position of the hydroxyl radicals, and is combined with the oxide film.

12. The method of claim 11, wherein the process of forming the acrylate film comprises:
    coating one surface of the Si-based resin layer with a material to form the acrylate film; and
    applying ultraviolet rays to the Si-based resin layer coated with the acrylate film.

13. The method of claim 12, wherein the acrylate film comprises a photoinitiator.

14. The method of claim 12, wherein the ultraviolet rays has a wavelength from about 300 nm to about 450 nm.

15. The method of claim 11, further comprising:
    adhering a fixation film to the other surface of Si-based resin layer.

16. A photolithography patterning method comprising:
    applying a pattern material to a printing roll to which a blanket is adhered;
    rotating the printing roll on a printing plate provided with a plurality of protrusions to transfer some of the pattern material to the protrusions of printing plate; and
    rotating the printing roll on a substrate to transfer the remaining pattern material of the printing roll to the substrate,
    wherein the blanket comprises:
    an Si-based resin layer;
    an acrylate film formed on one surface of the Si-based resin layer, wherein the acrylate film comes in contact with a pattern material including a solvent coated on the printing roll to protect the Si-based resin layer from permeation of the solvent; and an oxide film is formed between the Si-based resin layer and the acrylate film, wherein the acrylate film reacts on a hydroxyl radicals of the oxide film so that the acrylate film is displaced in a hydrogen position of the hydroxyl radicals, and is combined with the oxide film.

17. The patterning method of claim 16, wherein the process of applying the pattern material to the printing roll on which the blanket is adhered is carried out by coating the printing roll with the pattern material that includes a volatile solvent.

18. A method of manufacturing an LCD device comprising:

forming a light-shielding layer on a first substrate;

forming a color filter layer on the first substrate that includes the light-shielding layer;

forming gate and data lines crossing each other to define pixel regions on a second substrate;

forming a thin film transistor at each crossing point of the gate and data lines;

forming a pixel electrode connected with the thin film transistor; and forming a liquid crystal layer between the first and second substrates, wherein at least one of forming the light-shielding layer on the first substrate and forming the color filter layer thereon is carried out by the patterning method of claim 16.

\* \* \* \* \*